United States Patent [19]

Pourrezaei et al.

[11] Patent Number: 5,685,961

[45] Date of Patent: Nov. 11, 1997

[54] METHOD FOR FABRICATION OF METALLIZED MEDICAL DEVICES

[75] Inventors: Kambiz Pourrezaei, Dresher, Pa.; Richard Burnham Beard, Atco, N.J.; Raymond Leon Boxman, Herzliya, Israel; Irina Shvets, Philadelphia, Pa.; Mark DeLaurentis, Ocean Springs, Miss.

[73] Assignee: P & D Medical Coatings, Inc., Dresher, Pa.

[21] Appl. No.: 859,063

[22] Filed: Mar. 27, 1992

[51] Int. Cl.$^6$ .................... C23C 14/34; A01N 1/02
[52] U.S. Cl. .................. 204/192.15; 204/192.14; 216/83; 427/2.1; 427/2.28; 427/304; 252/79.1
[58] Field of Search .............. 204/192.12, 192.15, 204/192.14; 216/83; 252/79.1; 427/2.1, 2.28, 304

[56] References Cited

U.S. PATENT DOCUMENTS

| | | | |
|---|---|---|---|
| 3,627,663 | 12/1971 | Davidse et al. | 204/298.24 X |
| 3,884,793 | 5/1975 | Penfold et al. | 204/298.24 X |
| 4,253,463 | 3/1981 | Kim . | |
| 4,376,025 | 3/1983 | Zeag | 204/298.21 X |
| 4,466,874 | 8/1984 | Belkes, Jr. et al. | 204/192.14 X |
| 4,495,907 | 1/1985 | Kamo | 123/193 C |
| 4,886,505 | 12/1989 | Haynes et al. . | |
| 4,911,811 | 3/1990 | Mullaney, Jr. | 204/192.14 |
| 4,930,863 | 6/1990 | Croitoriu et al. . | |
| 4,960,753 | 10/1990 | Collins et al. | 204/298.24 X |
| 5,178,743 | 1/1993 | Kumar | 204/298.24 X |
| 5,320,908 | 6/1994 | Sondervall et al. . | |

OTHER PUBLICATIONS

Article "Meeting Report: Recent Conference Focuses on Toxicity and Environmetn", by Ellis, pp. 138–141 of the Jan. 92 issue of Medical Device and Diagnostic Industry.

"Effect of deposition parameters on properties of filmsdeposited on fibers by hollow cathode magnetron sputtering", by Ihsan et al., pp. 1304–1312 of J. Vac. Sci. Technol. A8(3), May, Jun. 1990, pub by American Vacuum Society.

(List continued on next page.)

*Primary Examiner*—Nam Nguyen
*Attorney, Agent, or Firm*—William H. Meise

[57] ABSTRACT

Catheters and other medical devices include plural layers of metals applied to the outer surfaces, which tend to close minuscule cracks through which corrosion may attack the underlying support. In some avatars, the initial layer of material is preferably silver, applied following specific preparation steps. In other embodiments, succeeding layers of metal completely cover the initial layer, and are also of silver. The succeeding layers are deposited after deposition of the prior layer, and tend to reduce the incidence of microscopic pores or cracks and are less prone to delamination. The succeeding layers are preferably of mutually different metals between layers. In a particular avatar, in which the exposed metals are oligodynamic silver and more noble platinum, the exposed silver layer lies over a portion of the platinum layer, to thereby prevent corrosion of the silver layer from disconnecting portions of the silver layer. Fabrication methods include deposition of successive layers by means of sputtering in a longitudinal array of cylindrical magnetron sections, in which each section applies one layer of the coating over the coating applied by the preceding section. The magnetron sections may be energized and deenergized in a temporal pattern associated with the progress of the workpiece material through the array, to thereby cover or expose particular longitudinal layers. In some embodiments, a first layer of electrically conductive material is deposited by electroless methods particularly in the lumen, following which additional layers may be applied by conventional electrolytic deposition. An electroless method according to the invention includes preparation steps which may include ultrasonically cleaning the surface with a solution of isopropyl alcohol, then drying the surface with a stream of dry gas, and etching the surface with a solution of sodium naphthalene in diethylene glycol dimethyl ether.

9 Claims, 7 Drawing Sheets

OTHER PUBLICATIONS

Pp. 169–172 of text "Plating of Plastics–recent Developments", by F.A. Domino, pub. by Noyes Data Corp, Park Ridge, NJ, also pp. 104–107.

"Metalizing Non–conductors" by Chas. Davidoff, at pp. 428–434 of the 46th annual Metal Finishing Guidebook Directory, pub. CA 1978 by Metals and Plastics Pubs. Inc. at One University Plaza, Hackensack, NJ 07601.

Article "Practical Formulations for Plating on ABS plastics" by John et al., pp. 51–54 of the Mar., 1986 issue of Metal Finishing Magazine, pub. by Metals and Plastics Publications, supra.

"Silver Alloy Coated Catheters Reduce Catheter–associated Bacteriuria", by Liedberg et al., pub. at pp. 379–381 of British Journal of Urology, vol. 65.

Official Gazette, Dec. 3, 1991, p. 111, US 5,069,227.

"Refinements in the Coating of Urethral Catheters Reduces the Incidence of Catheter–Associated Bacteriuria", published at pp. 236–240 of Eur Urol 1990, vol. 17.

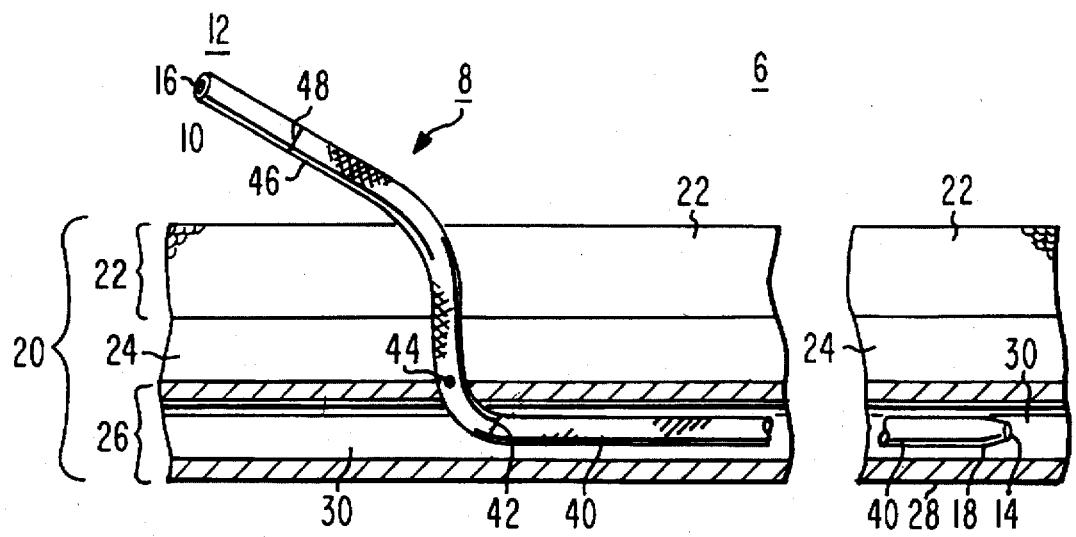
*Fig. 1*
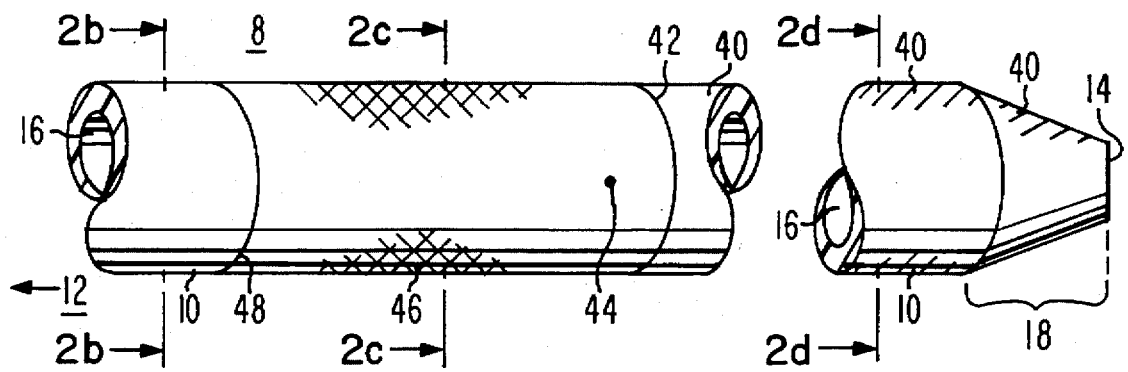
*Fig. 2a*
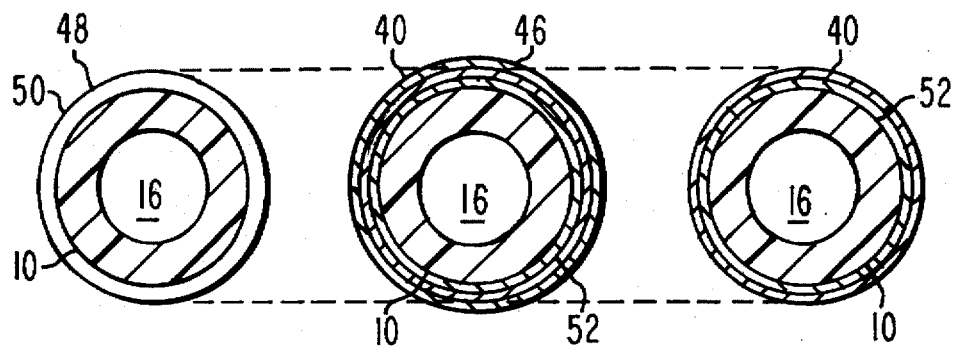
*Fig. 2b*   *Fig. 2c*   *Fig. 2d*

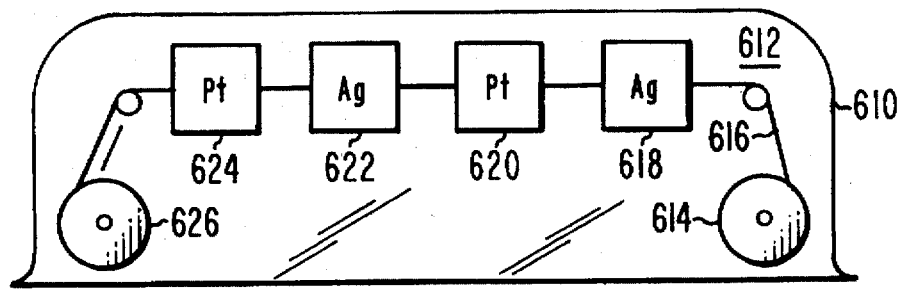
Fig. 6
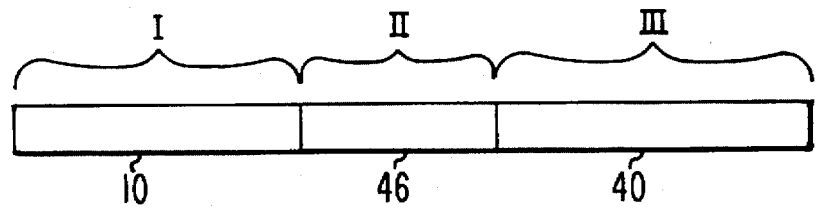
Fig. 7
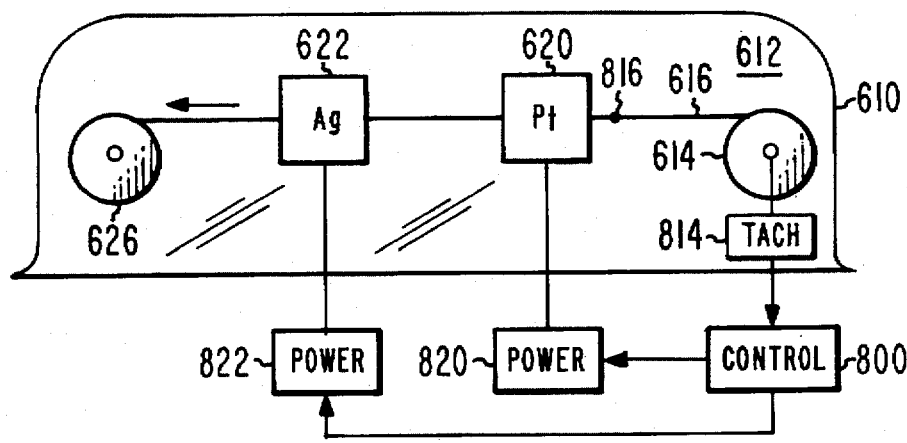
Fig. 8
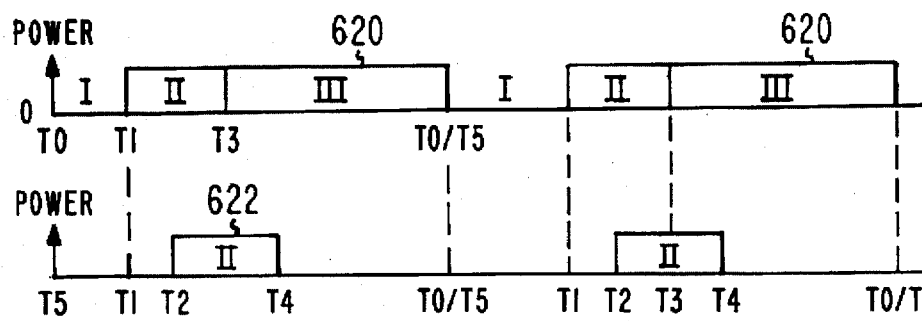
Fig. 9a
Fig. 9b

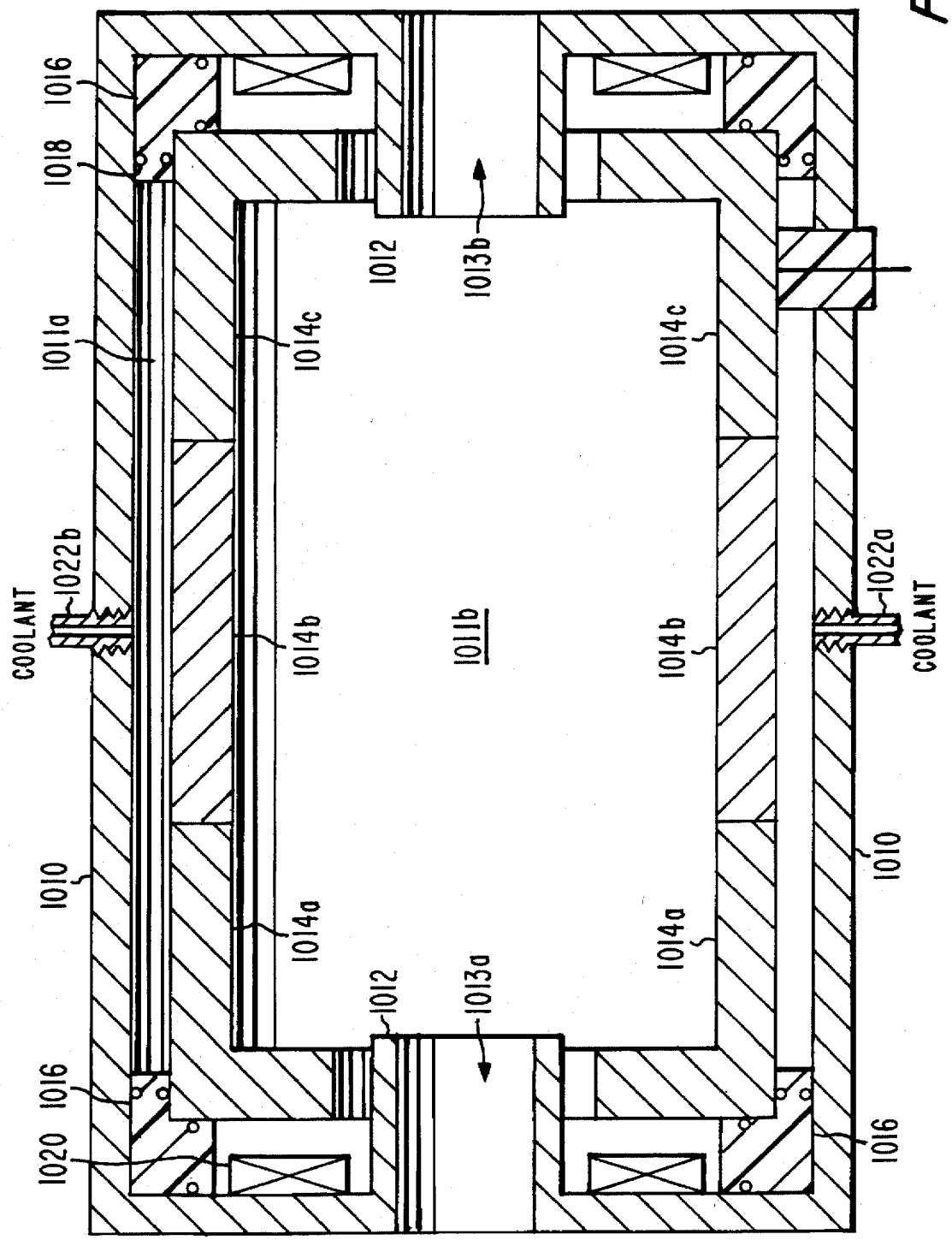

METHOD FOR FABRICATION OF METALLIZED MEDICAL DEVICES

BACKGROUND OF THE INVENTION

This invention relates to methods for fabricating catheters & medical devices, and to devices made by the described methods.

About three million central venous catheters and 200 million peripheral catheters are inserted yearly in the United States. A large percentage of patients into whom the catheters are inserted develop infections, with the attendant problems of additional time lost from work, complications leading to additional medical costs, or death. Catheter-related infections arise secondarily due to microbial colonization of catheter surfaces. Contamination arises from (1) the patient's endogenous skin flora; surface roughness of the catheter at the point of entry results in capillary action which tends to draw bacteria deep into the body or blood vessel, and from (2), contamination of materials placed inside the catheter, arising from, for example, contaminated seals or medications.

U.S. Pat. No. 3,598,127, issued Aug. 10, 1971 to Wepsic describes a catheter with chambers loaded with antibiotic agents which diffuse through a permeable outer coating. The antibiotic agent kills or inhibits microbes drawn or migrating along the exterior of the catheter. U.S. Pat. No. 4,612,337, issued Sep. 16, 1986 to Fox, Jr. et al, describes attaching antimicrobial agents to the catheter. Such antimicrobial agents have a short half-life, and may not be suitable for long periods of use.

U.S. Pat. No. 4,054,139, issued Oct. 18, 1977 in the name of Crossley, describes a catheter in which the surfaces are coated with small amounts of granular "oligodynamic" metals in a plastic matrix, to inhibit infection. Such metals are iontophoretic, in that they tend to produce dissolved ions when exposed to an electrolyte. The Crossley arrangement requires large amounts of silver (or other metal) relative to the amount of exposed metallic surface, because a large proportion of the metal lies within the plastic matrix and is not exposed to electrolyte, and so cannot produce ions. The regions between exposed metal granules may be subject to colonization by microbes. The manufacture may require additional steps, such as abrading the surface to expose the metal granules, and may therefore be costly. Also, the outer surface may be rough as a result of protrusion of the granules beyond the matrix, or deflection of the matrix away from the granules under the pressure of insertion, which might unnecessarily cause the patient injury, in that platelets or bacteria may adhere to and colonize the surface. Also, the roughness may prevent the skin from tightly squeezing about the catheter to provide a seal against microbial ingress along the outer surface of the catheter. The thickness of the plastic matrix material may a disadvantage for use on the inner surface of a catheter, because many catheters have an inner diameter of about 0.5 mm (about 0.02 inch), and a thick coating may unacceptably reduce the lumen diameter and thereby restrict the flow rate of fluids. This will be particularly true when the surface is rough.

U.S. Pat. No. 4,253,463, issued Mar. 3, 1981 in the name of Kim, describes a catheter in which a polyethylene body has aluminum or tin foil bonded to its outer surface. It appears that the Kim procedure may be limited to use with flat sheets. It may be difficult to attach a sheet of metal foil to the outer surface of a thin plastic tube without forming wrinkles in the foil, which could make insertion of the catheter difficult or painful. The thickness of foil may be excessive, and in any case no method is described to attach the foil within the lumen.

U.S. Pat. No. 4,886,505, issued Dec. 12, 1989 in the name of Haynes et al. describes invasive medical devices such as needles and catheters, which are made wholly from metals, or which may be made from metal, glass, plastic, rubber, ceramic or the like, including PVC, polyurethane, latex, or preferably silicones or polyolefins, to which biological activity is imparted by affixing thereto a plurality of conducting materials, which are stated to include conductors, semiconductors and metals or their oxides, and which are selected based upon the biological activity and synergism of the combination. According to Haynes et al, particulate metals may be coated onto the device, or added to a monomer before polymerization, or to a polymer before fabrication, or the metals may be coated, one over the other, onto all or part of the surface of the device, or they may be in the form of bands or wires. Pure metals or alloys may be used, applied by sputtering, in films from 5 to 500 nanometers thick. One embodiment is a silver-coated steel needle, and another is an uncoated aluminum needle. A catheter section of silicone coated with 20 nm of platinum, overlaid by a similar silver coating, is described.

An improved scheme for use of oligodynamic metals is described in copending patent application U.S. Ser. No. 07/859,059, entitled Metallic-Surface Vascular Antimicrobial, Antithrombogenic Devices, filed in the name of M. DeLaurentis et al, now abandoned. As described therein, an enhanced oligodynamic effect is achieved by making the outer surface of a catheter a smooth, continuous film of oligodynamic metal, such as silver, in the region where the catheter enters the body. In order to reduce the possibility of formation of a thrombus or clot, thrombogenic materials such as polymers or silver have reduced exposure in regions where the catheter may be expected to come into contact with blood. The principal portion of the catheter within a vas containing blood is made from an antithrombogenic metal such as platinum. The antithrombogenic action occurs in the described arrangement because red blood cells and platelets have a negative electrical charge, and when a galvanic couple of two metals is formed as indicated, the more noble metal (platinum in the described example) takes on a negative electrical charge, which tends to repel red blood cells and platelets, and accordingly they tend not to attach themselves to the surface of the metal. A further advantage of this arrangement is that, with few exceptions, bacteria and microbes are also negatively charged, and the resulting repulsive force may tend to reduce the likelihood of colonization of the surface. According to a further aspect of the catheter described therein, the inner surface of the catheter, or the periphery of the lumen, is a continuous layer of oligodynamic metal, to inhibit microbial activity associated with attachment to and colonization of the inner surface of the catheter. In order to reduce the possibility of formation of a thrombus inside the tip of the catheter in a region accessible to blood, the antithrombogenic material is wrapped around the tip of the catheter, into the lumen, and extends therein a short distance, to a location at which, when the catheter is in use, blood is not continuously present. Such a location is expected to be one or a few centimeters from the distal opening of the lumen.

A desirable flexible, biologically inert material, widely used in invasive instruments, is polytetrafluoroethylene, also known by the trade name TEFLON. While this polymer is thrombogenic, this is not an important aspect of its characteristics, because in the abovementioned DeLaurentis application the substrate material is not exposed. It has been discovered, however, that it is very difficult to cause reliable attachment or adhesion of metallic coatings to such a polymer, especially in the interior of a lumen which may be only 0.5 mm in diameter. For some desirable metals, there is no reliable "conventional" deposition method onto interior lumens of particular polymers. Also, it has been found that coatings of silver applied by conventional techniques may tend to separate from the substrate surface in small flakes after a period of immersion in biological electrolyte solutions such as blood. It is believed that this results from migration of the biological electrolyte or salt solution into microscopic cracks in the metal surface, whereupon the salts attack and dissolve the layer of silver adjacent to the polymer surface, causing loss of adhesion. Flaking metal is undesirable in a catheter which is inserted into the body during normal use.

Catheters are necessary during many medical procedures, for applying medications, and for monitoring and draining patients between procedures. When used for monitoring or for draining or the like, the catheters are likely to remain in place for a period of days rather than hours. The relatively high incidence and seriousness of infection attributable to indwelling catheters suggests that maximum precautions should be taken against such infections. As a result, indwelling catheters may be changed by being removed periodically to reduce the chance of colonization of the catheter surface, following which a new catheter is inserted. Catheters are also changed in the event of clogging due to formation of a thrombus in the lumen. However, the insertion of a new catheter is itself subject to risks such as perforation of a vessel or of carrying microbes into the body. A catheter which provided greater resistance to infections or colonization might, in certain cases, reduce the need to change catheters, and thereby reduce the risks associated with changing catheters, and also reduce costs by eliminating the need for use of a second, or even third, or possibly more, catheters, and the cost of insertion of the additional catheters.

It is desirable to have catheters useful for providing a path into the body for medical purposes, which are conveniently manufacturable, and which are arranged to minimize risk of infection, clogging of the lumen of the catheter or the vas.

SUMMARY OF THE INVENTION

Catheters according to an aspect of the invention include those in which plural layers of metals are applied to the surfaces, which tend to close minuscule cracks or pores through which corrosion may attack the underlying support structure. In some embodiments or avatars, the initial layer of material is preferably silver, applied following preparation steps which may include cleaning, drying and etching. In some embodiments, succeeding layers of metal completely cover the initial layer, and are also of silver. The succeeding layers are deposited after deposition of the prior layer has ceased, and such succeeding layers have unexpectedly been found to tend to reduce the incidence of microscopic pores or cracks and to therefore be less prone to delamination. The succeeding layers are preferably of mutually different metals between layers. In a particular avatar, in which the exposed metals are silver (or other oligodynamic metal) and platinum (or other more noble metal), the exposed silver layer lies over a portion of the platinum layer, to thereby prevent corrosion of the silver layer near the junction of the metals from electrically disconnecting portions of the silver layer from the platinum. Fabrication methods include deposition of successive layers by means of sputtering a continuous run of catheter material in a longitudinal array of cylindrical or coaxial magnetrons or magnetron sections or segments, in which each magnetron or section thereof applies one layer of the coating over the coating applied by the preceding magnetron or section of the array. The magnetrons or sections may be energized and deenergized in a temporal pattern associated with the progress of the catheter material through the array, to thereby cover or expose particular layers at particular positions along the length of the catheter material. In some embodiments of the invention, a first layer of electrically conductive material is deposited by electroless methods, following which additional layers may be applied by conventional electrolytic deposition. According to one aspect of the invention, a catheter includes a lumen with a diameter-to-length ratio which makes conventional metal deposition methods ineffective in depositing a smooth, continuous layer through the lumen, in which an electroless application method is used for depositions in the lumen. An electroless method according to the invention includes preparation steps which may include ultrasonically cleaning the surface with a solution of isopropyl alcohol, then drying the surface with a stream of dry gas, and etching the surface with a solution of sodium naphthalene in diethylene glycol dimethyl ether. After the preparation steps, the inner surface is acidified and neutralized by hydrochloric acid, sensitized with a solution of $SnCl_2$/HCl, and rinsed. The actual electroless plating is accomplished by a plating solution including $AgNO_3$, sodium dodecylbenzenesulfonic acid sodium salt, and ammonia solution, with acetic acid added for pH adjustment, together with a reducing solution of $N_2H_4$:$H_2O$ (hydrazine hydrate).

DESCRIPTION OF THE DRAWING

FIG. 1 is a cross-sectional view of a portion of a body including a dermal surface, avas, and a catheter according to the invention penetrating from the exterior to the interior of the body;

FIG. 2a is a perspective or isometric view, partially cut away to reveal interior details, of the structure of FIG. 1, illustrating details of the locations of metal coatings on the outer surface of the catheter, and FIGS. 2b, 2c and 2d are cross-sections thereof, FIGS. 2a, 2b, 2c and 2d are together referred to as FIG. 2;

FIG. 6 is a simplified diagram illustrating a continuous sputtering method according to an aspect of the invention;

FIG. 7 is a simplified overall representation of a length of catheter material, designating regions to be coated or metallized;

FIG. 8 is similar to FIG. 6, and illustrates control aspects of the invention using continuous sputtering;

FIG. 9a is an energization-versus-time plot of a magnetron of the arrangement of FIG. 8, and FIG. 9b is a similar plot for another magnetron thereof, to show relative timing, FIGS. 9a and 9b are together referred to as FIG. 9;

FIG. 10 is a cross-sectional view of a coaxial magnetron according to an aspect of the invention, in which the target is segmented into portions having different metals for continuous coating with successive layers of dissimilar metals;

FIGS. 15a and 15b are referred to jointly as FIG. 15.

DESCRIPTION OF THE INVENTION

Figure 3:
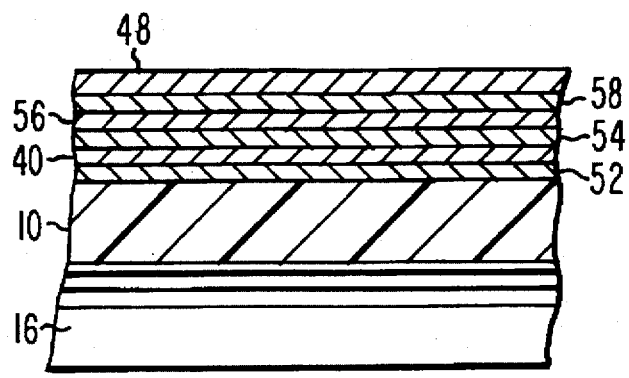
FIG. 3 is a cross-section of a portion of a catheter including a body defining a lumen, in which a base or foundation layer of oligodynamic metal coats the exterior surface of the body, and upon which foundation coat a layer of a metal more noble than the oligodynamic metal is applied, followed by a additional layers of both metals in certain regions.

FIG. 1 is a depiction of a catheter in accordance with an aspect of the abovementioned DeLaurentis application. In FIG. 1, a cross-section of a portion 20 of body tissue near the skin or dermis 22 includes portions of the adventitia 24, and also includes portions of a blood vessel, vas or other hollow organ 26 in which blood is found, hereinafter "vas" Vas 26 includes a wall 28 ande a lumen 30. The illustrated location is one in which a catheter designated generally as 8 penetrates from the exterior 6 of the body, through the dermis and adventitia, and through wall 28 into lumen 30. The most proximal portion of the catheter as illustrated in FIG. 1 is designated 12, but those skilled in the art will recognize that portion 12 extends proximally beyond the illustrated proximal portion 12 to one or more utilization devices. As illustrated in FIG. 1, an elongated distal portion of catheter 8 extends alone lumen 80 of vas 26 to a most distal portion 14 of the catheter. A lumen 16 extends through catheter 2 from proximal portion 12 to distal portion 14. In a region 18 near distal end 14, the body thickness or outer diameter of catheter body 10 tapers to a smaller diameter. A catheter such as 8 may be a conduit for other catheters which pass through lumen 16, or may itself be used for application of medication, suction or the like.

In FIG. 1, large portions of the outer surface of body 10 of catheter 8 are coated with metal. In particular, a point 44 is defined along the length of catheter 8, which point is the position at which the body of catheter 8 extends through wall 28 of vas 26. Strictly speaking, the term "point" is not correct, in that the point actually is defined by a plane transverse to the axis of the catheter in the region in question (a "local" axis). However, the relatively small size of the particular catheter described makes the two terms analogous, and a "point" is easier to understand than the aforementioned transverse plane. The location of point 44 is that at which, if microbes are to enter the blood stream along the exterior surface of the catheter, the entry takes place. According to an aspect of the invention, a coating 46 of oligodynamic metal, preferably silver (hereinafter "silver") is applied to the outer surface of catheter body 10 from near point 44 to a point 48 on catheter 8 which is outside the body when point 44 is at the point of entry into lumen 30 of vas 26. The coating goes all the way around the body of the catheter in the region between points 44 and 48. The presence of silver on the exterior surface of the catheter in this interdermal region generates ions which, in a region immediately adjacent to the catheter surface, inhibit or kill microbes. For this purpose, the term "inhibit" means to prevent the microbes from reproducing or otherwise rendering them harmless.

As so far described, the structure of catheter 8 of FIG. 1 uses an exterior coating of silver in a manner similar to that of the Crossley patent, except that the entire outer surface in the interdermal region is active, in comparison with Crosstey's separated granules. Thus, a much larger surface is available for generation of ions than in Crossley's arrangement. In order to produce an electromotive force which tends to drive silver ions into solution in the interderma region, a further dissimilar metallic coating or layer 40 connects to silver coating 46 at a galvanic junction 42. The term "galvanic" in this context means a metallic junction, which can be formed. for example, by overlapping one coating onto the other in the junction region. Coating 40 is of a metal which is more noble than the oligodynamic metal of coating 46. when coating 46 is silver, as described above, coating 40 is preferably platinum. Platinum coating 40 extends from junction 42 to distal end 14 of catheter 8, and completely covers the exterior of the body of the catheter from junction 42 to distal end 14 of the catheter, and may also extend somewhat within the lumen. The length dimension of catheter 8 between junction 42 and distal end 14 is selected depending upon the distance between point of entry 44 and the desired location of the distal end. For example, for a catheter intended to reach from the subclavicular region to the superior vena cava heart in an average-size male, the length is about 8 to 12 inches. Monitoring catheters may be more than a meter in length. The metallic coating according to the invention may, if desired, extend only partway through the interior of the lumen.

Silver-coated portion 46 of catheter 8 of FIG. 1, which extends from about point 44 to location 48 outside the body, has a length which is selected by considering that a vas such as vas 46 is seldom more than 1½ inches below the outer surface of dermis 22. It will seldom be possible to position metallic junction 42 precisely at point 44, and it may even be undesirable to do so, because the silver would not necessarily extend all the way through wall 28 of vas 26. Also, the same considerations apply to the exterior surface of dermis 22, in that silver coating 46 should extend somewhat above the surface. While coating 46 could, in principle, extend all the way to the proximal end (not illustrated) of the catheter, a slight risk is thereby created of inadvertent contact between the electrically conductive silver coating and an external source of electrical energy, which might harm the patient. Even if there were no danger of inadvertent contact, such a structure constitutes an antenna capable of transducing electrical energy from the surroundings. Thus, the length of silver-coated portion 46 should be greater than the maximum interdermal length of about 1½ inch, but in some applications need not extend very far outside the surface of the skin, to reduce even that slight risk. A length of about 3 inches should provide more than enough length of silver coating without being excessive, thus providing about 1½ inches within the interdermal region and an additional 1½ inches without.

As mentioned above, it is disadvantageous to have thrombogenic materials in a blood vessel or other blood-containing vas, because of the potential for generating a thrombus or clot on the thrombogenic surface. While silver has an antimicrobic action, it is also thrombogenic. By minimizing the length of silver within the vas, the likelihood of forming a medically significant thrombus or clot is also minimized. When coating 40 is platinum, a galvanic couple is formed between silver coating 46 and platinum coating 40 when the catheter is inserted into the body, which tends to drive silver ions into solution in the interdermal region. This advantageously increases the silver ion density in the interdermal region over the density produced by a silver surface alone, without a galvanic couple. The platinum coating is not thrombogenic, because it becomes negatively charged. The platinum coating 40 extends all the way to distal end 14 of catheter 8, and around the distal tip of catheter 8 into lumen 16. Thus, most regions of the catheter within the vas, including those near the tip, which have a small radius of curvature, are coated with nonthrombogenic or antithrombogenic material. This aids in inhibiting the formation of clots at and near the distal end 14 of catheter 8.

FIG. 2a is a isometric or perspective view of a portion of catheter 8 of FIG. 1 in accordance with the invention. FIGS. 2b, 2c and 2d are cross-sectional views of the structure of FIG. 2a looking in the direction of section lines 2b—2b, 2c—2c, and 2d, 2d, respectively. Elements of FIG. 1 corresponding to FIG. 2 are designated by the same reference numerals. The relationship of the lumen to the body of the catheter is readily apparent in FIG. 2. In FIG. 2, the thickness of the various metallic coatings is exaggerated for ease of viewing. the minimum thickness of the silver coating depends upon the length of time the catheter is expected to be indwelling and the expected rate of "corrosion"or depletion of the silver as it goes into solution. A corrosion rate of about ½ micron per week is predicted, so a few microns should be more than enough for ordinary use. The maximum thickness is that which reduces the flexibility of the catheter tube, or which may result in cracks when flexed. As illustrated in FIG. 2b, that portion of catheter 8 more proximal than the end 48 of exposed silver coating 46 is not coated with metal, and the thickness of the various metal coatings is visible as 50. The cross-section of FIG. 2c is taken at a location with an exterior metal coating, so the coating is seen in cross-section. Coating 50 is made up of a first or interior coating or layer 52 of silver, provided as a base upon which additional metal coatings may be applied. A second layer 40 of platinum extends from defining end 48 to the distal end of the catheter, while coating 46 is a layer of silver overlying platinum layer 40 from defining end 48 to unction 42. This arrangement has the advantage that, during manufacture, the exterior of catheter 8, from defining end 48 of the metallic coatings to distal end 14, may be coated with platinum, without a further masking step for defining the silver-platinum junction 42. This arrangement has the further advantage that plural metal layers overlie underlying silver layer 52 between defining ends 42 and 48, to reduce the number of pores or cracks through which corrosive fluids may attack the bond between initial silver layer 52 and polymeric substrate body 10. The cross-section of FIG. 2d illustrates the underlying silver layer 52 and the platinum layer 40 at locations more distal than defining end 42. FIG. 3 illustrates, in cross-section, a portion of a catheter including a body 10 defining a lumen 16, in which a base or foundation layer 52 of silver coats the exterior surface of the body in the illustrated region, and upon that foundation coat a first layer 40 of platinum is applied, followed by a second layer 54 of silver, a third layer 56 of platinum, and a fourth layer 58 of silver . . . until the outer exposed layer is reached, which may be layer 48 of silver as illustrated, or another layer of platinum in those regions in which antithrombogenic action is desired.

As so far described, the structure of the catheter has similarities to one of those described by Haynes et al, but differs in that Haynes et al. completely coat the inner layer of metal with the outer layer, in effect "sealing" the inner layer within the outer layer. In principle, there should not be any electrolyte in contact with the inner layer of metal in the Haynes et al arrangement, and therefore a galvanic couple should not be formed. Since they report antimicrobial action when an inner silver layer is completely coated with platinum, and also report that platinum alone does not provide antimicrobial action, it seems reasonable to believe that the platinum layer has pores and or cracks, or possibly unplated edges, which allow electrolyte to reach the silver, and which therefore produces an electromotive force tending to drive silver ions into solution. While some silver ions can be expected to escape through such pores and cracks, the number so released must be small by comparison to those available in a structure such as that of the invention.

Figure 4:
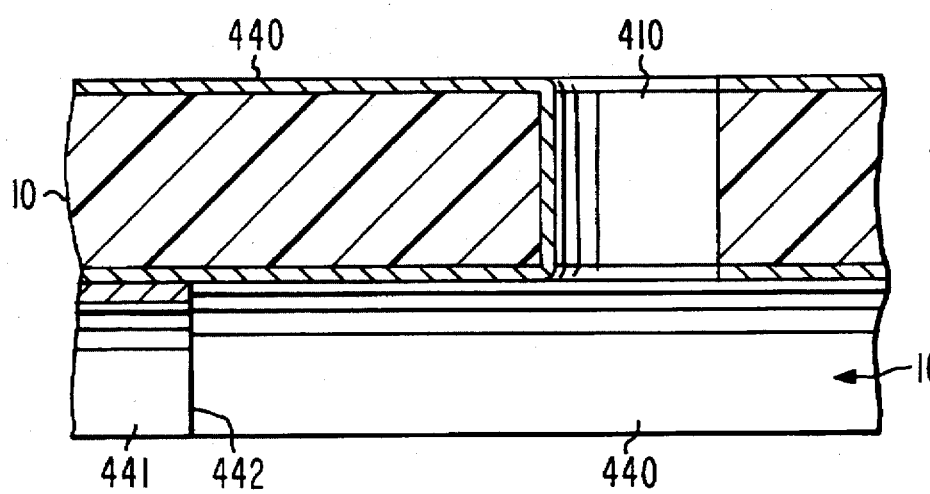
FIG. 4 is a cross-section of a portion of a catheter in accordance with an aspect of the invention, in which a layer of antithrombogenic metal is exposed within and without the catheter near the distal region.

FIG. 4 is a cross-section of a portion of a catheter in accordance with the invention. In FIG. 4, a portion of catheter 8 near the distal end includes a body 10 defining a lumen 16, only a portion of which is visible. An aperture 410 extends from lumen 16 through the side wall to the exterior of the catheter. Such an aperture may be used for obtaining samples, but could as easily be an axial aperture opening at the very distal end of the catheter. In FIG. 4, the entire body of the catheter, both inside and outside, is coated with a layer of metal designated 440. Layer 440 is a composite of a plurality of layers as describe in conjunction with FIG. 3, including a base coat and one or more additional coats of metal, the uppermost or exposed layer of which is antithrombogenic, or platinum in the preferred embodiment. Layer 440 extends from the exterior of body 10, through aperture 410, and is continuous with coating 440 on the surface of lumen 16. Also visible in FIG. 4 is a portion of a layer 441 of oligodynamic metal, exposed within lumen 16 at locations more proximal (to the left in FIG. 4) than an edge defining point or line 442. As described above, the arrangement of FIG. 4 provides an exposed coating of antithrombogenic metal on the exterior of the catheter, in the aperture between the exterior and the lumen, and within the lumen in regions where blood may be encountered, which is within a few millimeters or centimeters of aperture 410, depending upon the application, together with an antimicrobial metal in those portions of the lumen not normally containing blood.

Figure 5A:
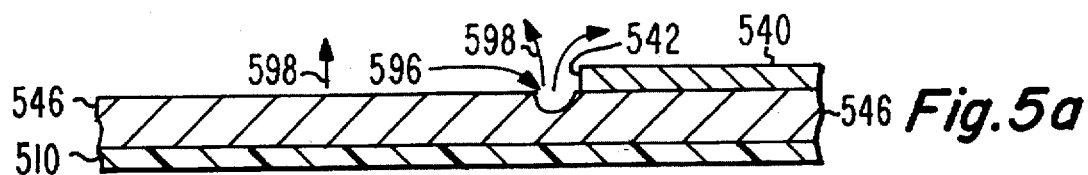
FIGS. 5a, 5b AND 5c, referred to jointly as FIG. 5, illustrate the location and effects of corrosion of the oligodynamic or iontophoretic metal, and the effect of the particular layering according to an aspect of the invention.
Figure 5B:
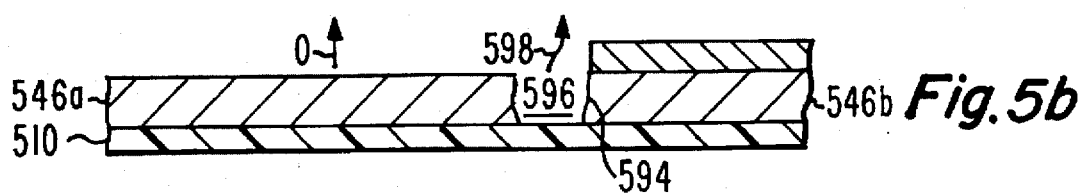
Figure 5C:
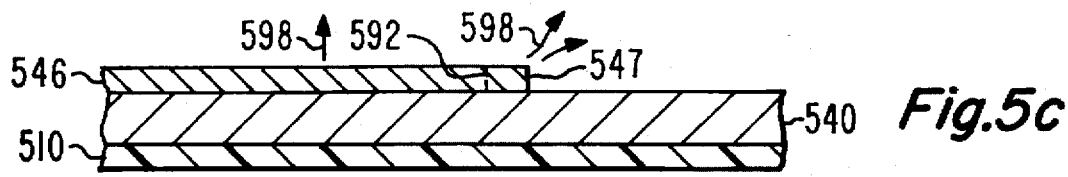

FIGS. 5a, 5b AND 5c illustrate an advantage of a configuration according to the invention. In FIG. 5a, a portion 510 of a polymer catheter substrate is overlaid by a layer 546 of silver, which in turn is overlain by a layer 540 of a more noble metal, herein platinum. As illustrated by arrows 598, ions preferentially leave the silver surface near the edge 542 of the silver-platinum defining edge. As illustrated in FIG. 5a, this tends to corrode the silver layer, resulting in a pit or depression 596. As illustrated in FIG. 5b, after a period of time, pit 596 becomes large enough to eat through to substrate 510, at which time the effect of the galvanic couple is eliminated as to that portion of the silver layer designated 546a, because it becomes electrically disconnected from portion 546b. This in turn reduces the iontophoretic activity, because only an edge 594 of exposed silver subject to galvanic action remains. In FIG. 5c, the positions of the metals are reversed, with the platinum on the bottom and the silver atop. While this might initially appear to be the same as that of FIGS. 5a and 5b, it is very different, in that the corrosion preferentially corrodes silver layer 546 near its end 547, but this corrosion only slightly reduces the total exposed silver area, without disconnecting any portion of the layer. Even if the end 547 of silver layer 546 is eaten back to point 592, the total exposed area of silver is reduced by only an insignificant amount.

Some prior-art arrangements for sputtering may not be suitable for cost-effective manufacture of catheters according to the invention. In particular, some prior-art sputtering schemes using planar magnetrons are capable of applying only about 100 Å of metal per second without excessive heating of such a workpiece. At such a rate of deposition, the desired thicknesses of metal, which are on the order of one or a few microns where one micron equals one-millionth of a meter, or about 40 microinches), the deposition time for one layer might be 100 seconds. Considering that a catheter is relatively long and that sputtering may not be effective simultaneously along the entire length of the catheter, and that plural coats are contemplated, sputtering of the conventional variety may not be suitable for economical manufacture. It should be noted that a planar magnetron such as that mentioned above is intended for coating planar surfaces, and when used to coat a thin catheter workpiece tends to create an uneven coating, and tends to require substantial energy, some of which is transferred to the workpiece.

In conventional sputtering, the workpiece is placed in a low-pressure chamber filled with an inert gas such as argon. Voltage is applied between the electrodes of a magnetron, which results in a glow discharge, in which electrons become separated from inert gas ions. Collisions between electrons and molecules or atoms of the inert gas create ions of the inert gas, and the number of collisions is increased by the spiral or helical path taken by the electrons in the presence of the magnetic field. The ions of inert gas accelerate toward the target, and upon impact tend to dislodge atoms of the target material, which is selected according to the desired deposition material. Some of the atoms so dislodged coat the workpiece.

In accordance with an aspect of the invention, metals are applied to at least some surfaces of the catheter by a cascade of sputtering steps. It is advantageous to use cylindrical or coaxial magnetrons, because they apply the coating uniformly around the workpiece, since the circular or circumferential symmetry results in a corresponding circumferential symmetry of the coating of the workpiece, and when using expensive target materials such as platinum, because the circular symmetry results in consumption of less deposition material in order to achieve a particular minimum thickness of the deposition, due to redeposition onto the target of sputtered atoms which "miss" the workpiece. A further advantage of a coaxial magnetron is that its diameter may be reduced for small diameter workpieces, which requires less power during operation, thereby reducing heat transfer to the workpiece at a given deposition rate, tending to prevent overheating of the workpiece.

FIG. 6 is a simplified diagram illustrating a sputtering method according to an aspect of the invention. In FIG. 6, a "bell jar" includes an interior region 612 containing low-pressure argon (or other inert gas). Within interior region 612, a supply reel 614 is wound with a supply of elongated catheter polymer tube or workpiece 616 which is to be metallized. The workpiece is cleaned and prepared for metallization according to any prior-art method. Workpiece 616 extends as illustrated through a plurality of cascaded magnetrons 618, 620, 622 and 624, and to a take-up reel 626. The magnetrons are powered in conventional manner, but in common, and have targets of different materials. As illustrated, magnetrons 618 and 622 are designated Ag, thereby signifying that the target metal is silver, and magnetrons 620 and 624 are designated Pt, indicating platinum. In operation, each point on the workpiece moves sequentially, at constant speed, through the cascade of magnetrons, at each station being sputtered with the desired metal. In particular, as the catheter tube 616 passes through magnetron 618, it receives a coating of silver, following which a layer of platinum is applied in magnetron 620, more silver in magnetron 622, and finally a further layer of platinum is applied in magnetron 624 before the workpiece is wound on takeup reel 626. As might be expected, this creates a continuous multilayer coating in one pass, thereby obviating the need for moving reels of partially processed material from one chamber to another, and without the possibility of contaminating the surface between coatings, thereby achieving a manufacturing cost reduction. As is known in the art, instead of including the supply and takeup reels within the vacuum chamber, it is possible to use the "load lock" technique for supplying the workpiece from a reel at atmospheric pressure, through O-ring seals separating a succession of chambers at successively lower pressures, through the sputtering chamber, and back to a takeup reel, also at atmospheric pressure, through a further succession of load lock chambers.

In accordance with a particular aspect of the invention, the successive magnetrons of FIG. 6 all have targets of the same metal, for example silver. Thus, successive coats of the same metal may be applied to the same workpiece, which as mentioned above unexpectedly provides improved sealing of pores and cracks, and provides improved adhesion, at least in the case of silver over a particular polymer.

Figure 15A:
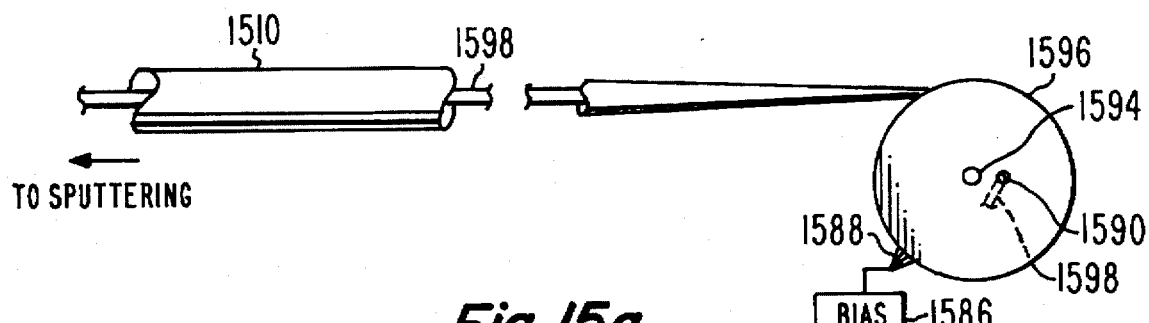
FIG. 15a is a simplified representation of an arrangement for applying bias to a sputtering electrode or wire within the lumen of a tube during manufacture.
Figure 15B:
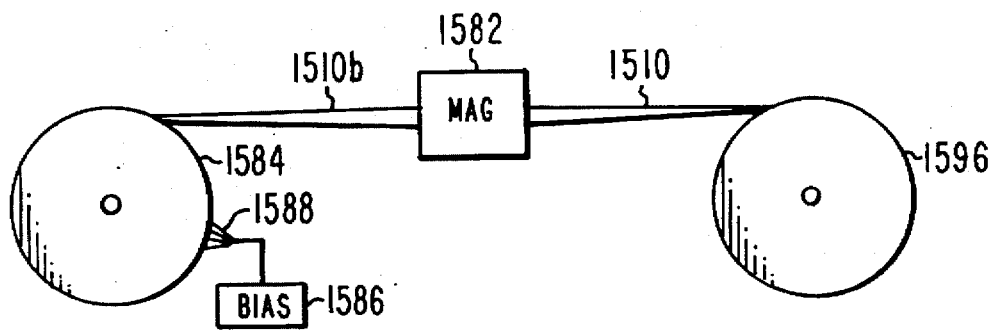
FIG. 15b is similar but relates to the takeup reel.

It may be desirable to bias the sputtering deposition as is known in the art. In particular, biasing may be accomplished by placing an electrically conductive wire through the lumen of the catheter before it is placed on the supply reel, as illustrated in FIG. 15a, and applying a bias voltage, generally less than a hundred volts, to the wire while the tube is passing through the sputtering apparatus or magnetron. In FIG. 15a, catheter Lube or workpiece 1510 has a conductive wire 1598 extending therethrough. The catheter tube is wound on a conductive supply reel 1596, which rotates on an axle 1594. The end 1592 of wire 1598 adjacent axle 1594 is captured under a screw 1590, which holds wire end 1592 in electrical contact with the reel. A conductive brush 1588 provides a connection between the rotating reel 1596 and a bias voltage supply 1586. The bias voltage affects the energy of the ions impinging upon the surface being coated. As the bias voltage increases, the energy of the ions impinging upon the surface increases, and the tendency for the ions to adhere increases. When bias voltages above about 150 or 200 volts are applied, the ions begin no implant themselves into the substrate material, with harder substrate materials requiring higher voltages. When so implanted, the resulting implanted atoms tend to adhere better than a simple surface coating. As an alternative to the use of an inner wire 1598 for bias, the takeup reel may be biased as illustrated in FIG. 15b, even if a central wire is not used, so that the coated portion of the tube within the magnetron is biased. In FIG. 15b, uncoated catheter tube workpiece 1510 leaves supply reel 1596 and passes through magnetron apparatus 1582 for metallization therein. That portion 1510b of the catheter tube downstream from magnetron assembly 1582 is coated with metal, and is therefore conductive. Once a metallized portion of the workpiece reaches a conductive takeup reel 1584, bias voltage is applied from bias source 1586. through brush 1588 and reel 1584 to the metallized portion of the workpiece within magnetron assembly 1582, because the conductive coating extends from within the magnetron to the takeup reel. The bias voltage applied to the exterior surface of the catheter tube by the takeup reel will not provide a bias in the sputtering region until a few centimeters or inches of tube have been wound onto the takeup reel, depending upon the distance between the sputtering region and the takeup reel. Preferably, the bias voltage is applied to both a wire extending through the lumen (by way of the supply reel as described above) and also to the takeup reel to bias the conductive exterior surface, also as described, so that bias voltage is provided in the region in which the metallization is just beginning to be formed, to thereby promote adhesion, and so the bias voltage continues to be provided where the coating is more fully formed, which would shield the conductive wire.

A particularly advantageous method for sputtering the exterior surface is to first coat the interior of the lumen with a conductor, and to apply a bias voltage to the conductive interior coating while performing the sputtering of the exterior surface. The first coating of conductor may be by electroless methods described below, or by conventional methods if applicable. In this arrangement, only the takeup reel needs to have the bias supply voltage, and is connected to both the inner conductive surface of the catheter tube and to the exterior surface of the workpiece.

FIG. 7 illustrates a simplified catheter as generally described in conjunction with FIGS. 1 and 2, in which a body 10 is uncoated in a region I, has a coating of silver over platinum in region II, and a coating of platinum in region III. FIG. 8 is similar to FIG. 6, but is simplified to include only two magnetrons, and further includes individual power supplies 820 and 822 coupled to magnetrons 620 and 622, respectively, and also includes a tachometer or rotation counter illustrated as a block 814, which is coupled to the supply reel 614, to provide information about the longitudinal speed of the workpiece through the stations. A controller illustrated as a block 800 receives information from tachometer (or other speed indicator) 814, and switches or controls the application of power to the magnetrons to form the desired pattern of metallization. Its operation is simply a matter of timing, and may be understood by considering a point 816 on the workpiece, which point is about to enter magnetron 620. In order to have an uncoated region such as I of FIG. 7, both magnetrons must be deenergized during those periods in which point 816, and a certain distance following point 816, are within the magnetrons. The moment at which point 816 on the workpiece enters magnetron 620 may be designated as reference time To. In FIG. 9a, which illustrates the application of power to magnetron 620 as a function of time, power is not applied to magnetron 620 for a period To-T1, which is established to allow point 816 on the workpiece to pass therethrough. At time T1, power is applied to magnetron 620 to begin coating with platinum, and this application of power continues until a later time T0/T5, sufficient for the correct length of platinum plating to be performed in regions II and III of the catheter. Time T5 of one recurrent cycle corresponds to time T0 of the next following cycle, so T0/T5 is the end of one cycle and the beginning of the next. Magnetton 622 is energized beginning at a time T2, sufficiently later than time T1 for the leading edge of region II to arrive at magnetron 622 at the workpiece speed. Magnetton 622 is deenergized at time T4, sufficiently later than time T2 for region ii to be plated with silver. The pattern of energization and deenergization continues, with a new time T0, associated with a new portion of workpiece, beginning contemporaneously with the ending time T5 of sputtering in magnetron 620. Two such cycles appear in FIG. 9. It should be noted that there is no necessary relationship between the times of energization of the magnetrons, as that will depend upon their spatial separation and the workpiece speed. The described method of continuous coating may of course be extended to any number of layers exceeding two.

Instead of using separate magnetrons as described in conjunction with FIGS. 6 and 8, a single magnetron may be used, in which separate cathode sections or segments produce regions of alternating metallizations, but in which control cannot be accomplished in much the same manner as that described in conjunction with FIG. 9. In FIG. 10, a segmented cylindrical magnetron includes a body portion 1010 in the general shape of a cylinder defining a central cavity 1011, and also defining a pair of targets 1012 surrounding input and output apertures 1013a and 1013b. A target is made from metal portions 1014a, 1014b, and 1014c, and the target is held away from the inner walls of body 1010 by dielectric spacers 1016. Sets of O-rings, one of which is designated 1018, provide a seal between a exterior portion 1011a of cavity 1011 and a central portion 1011b of cavity 1011. A coolant ingress pipe 1022a and an egress pipe 1022b together allow flow of coolant liquid through cavity portion 1011a. Cavity portion 1011b is maintained at a low pressure of inert gas, as described above, by means, not illustrated. A plurality of magnets, one of which is designated 1020, are affixed around cavity 1011. Target 1014 includes portions 1014a and 1014c which are made from (or at least coated with) silver, and also includes another portion 1014b which is made from platinum. A high-voltage feedthrough connector 1026 allows application of energizing voltage between target 1014 and the anodes 1012. When energized, electrons spiralling between the target and the anode collide with atoms of gas, creating ions, which are attracted to the target and upon impact create dislodged atoms of the target material. The concentration of free atoms of target material vary in an axial direction along the length of the segmented magnetron, in accordance with the material of the target in the vicinity. Thus, a single magnetron can coat successive layers of different metals onto a length of material traversing the magnetron.

As so far described, the application methods involve sputtering of metals onto the surface of the catheter. It would be possible to use such sputtering methods to deposit layers inside the lumen of a catheter by sputtering onto a side of an elongated sheet of polymer, and then rolling the sheet to form a tube, with the metallization on the inside. However, the formation of a seam may be a problem. Depositing a smooth layer of metal along the interior surface of the lumen of a catheter becomes more difficult as the lumen diameter becomes smaller and the length becomes greater. Chest drainage catheters may have a lumen diameter of about ¾ inch, and may be five inches or more in length, which corresponds to a length-to-diameter ratio of about 5. With this ratio or with greater ratios, access to the interior. surface becomes difficult. For catheters with diameters of 0.050 inch and a length of a foot or more, access is essentially impossible. According to another aspect of the invention, an electroless deposition method may be used to apply metallic coatings to a surface of the catheter, particularly the inner surface of the catheter (the surface of the lumen). U.S. Pat.

No. 4,930,863, issued Jun. 5, 1990 in the name of Croitoriu et al, describes a method for applying an optically reflective coating to the inside of a fiber waveguide. As therein described, the reflective coating is silver iodide, which is in itself not of interest. However, a step in the production of the silver iodide coating involves the plating of silver by an electroless method. In general, the Croitoriu et al. method involves preparation of the surface of the waveguide by etching, acidifying, and sensitizing, with various rinsing steps. A mixture of silver-plating solution and a reducer are then introduced, causing deposition of silver onto the substrate, after which the iodizing is performed. It was found that the steps of silver plating resulted in a surface which flaked when the tube was flexed, and upon which an "adhesive tape" test failed, i.e. metal was removed. Also, the etchant described by Croitoriu eL al. must be mixed specially, and may create a danger of explosion during the preparation of the etchant.

It was found that improved adhesion of the metal plating could be achieved by a modification of the Croitoriu et al. method, and more particularly by preparing the surface to be plated by the steps of cleaning with an ultrasonic cleaner in a solution of 2-Propalol or isopropyl alcohol $CH\, CHOHCH_3$ for three hours, followed by drying with a stream of Nitrogen for 15 minutes, followed by etching with a solution of sodium naphthalene in diethylene glycol dimethyl ether with a concentration of sodium naphthalene of approximately 0.7 Mol/liter. Fhis etchant is available from commercial suppliers, as for example CHEM-GRIP TREATING AGENT available from Norton Performance Plastics of Wayne, N.J. The etching step is performed insofar as possible in an inert, dry atmosphere such as nitrogen or argon, at room temperature, for a duration of about one to four minutes.

Following the preparation described above, the Croitoriu et al. method is used up to the iodizing step to apply the silver plating. These steps include washing with N-butyl alcohol or methyl alcohol, or acetone, followed by rinsing with deionized water. Etching with sulfochromic acid solution containing 75 grams/liter (g/l) chromic acid, and 250 g/l sulfuric acid, at room temperature for a duration of 20 seconds, followed by washing with distilled water. The surface is then cleaned in diluted hydrochloric acid, followed by another rinse in deionized water. The surface is then sensitized with a solution containing 70 g/l stannous chloride, and 40 ml/l of hydrochloric acid ($SnCl_2$/HCl), at room temperature for between 5 and 15 minutes, and then washed with deionized water. The sensitized surface is activated with a solution containing 1 g/l of palladium chloride, and 5 ml/l of hydrochloric acid $PdCl_2$/HCl), at room temperature for five to ten minutes, followed by another rinsing with deionized water. Plating is accomplished by flowing a silver plating solution at room temperature over the surface, and more particularly through the lumen of the catheter for inside plating. The silver plating solution contains 0.05 to 0.6M $AgNO_3$, $4.3\times10^{-4}$M dodecylbenzenesulfonic acid sodium salt ($C_{12}H_{25}C_6H_4SO_3Na$), also known as dodecylbenzenesulfonate, 4.75M ammonium hydroxide ($NH_4OH$), and a quantity of acetic acid ($CH_3CO_2H$) sufficient to bring the final pH into the range from 7.5 to 10. A reducer solution is added immediately prior to or concurrently with application of the silver plating solution, over or through the catheter. The reducer solution contains 0.15M of hydrazine hydrare ($N_2H_4.xH_2O$). Following the plating, the surface is rinsed in deionized water, and dried in a stream of inert, dry gas for 15 minutes. As mentioned, the cleaning and plating steps as described above produce films having improved adherence to the substrate.

According to an aspect of the invention, the sensitizing and activating steps are combined by using a solution containing 1 g/l of palladium chloride, and 100 ml/l of hydrochloric acid, at room temperature for between 5 and 15 minutes.

Figure 11:
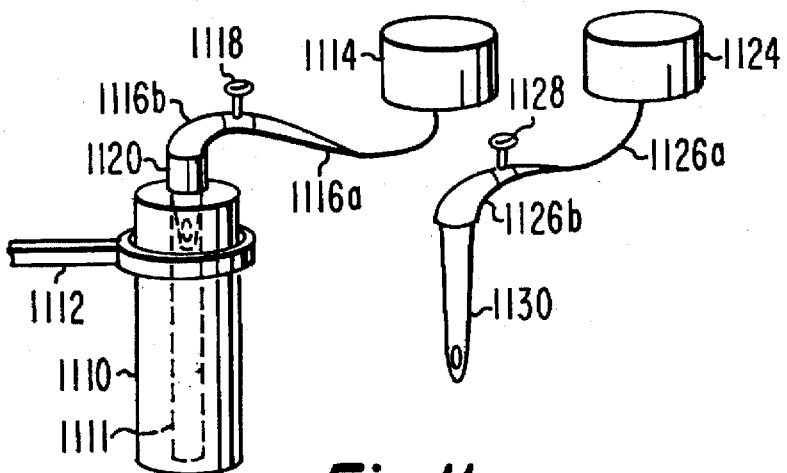
FIG. 11 is a simplified representation of an electroless plating or deposition method for the interior of a lumen.

In accordance with an aspect of the invention, the silver plating solution and the reducing solution are successively applied to the upper end of a catheter tube prepared for plating as described above, and the solutions flow down through the tube under the impetus of gravity. FIG. 11 illustrates such a catheter 1110, held by a fixture 1112 so that the principal portion of the catheter body depends therefrom. A reservoir 1114 of plating solution communicates through a Lube 1116a, a valve 1118 and a second tube 1116b with an adapter illustrated as a hollow needle 1120. which fits tightly into the upper end of lumen 1111. When valve 1118 is turned ON, silver plating solution flows from reservoir 1114 into the upper end of lumen 1111. When the silver plating solution starts to emerge from the lower end of the catheter, valve 1118 is turned OFF, and needle 1120 is removed from the lumen. A second needle, such as needle 1130, is introduced into the lumen, and reducing solution is allowed to flow from a reservoir 1124, through tubes 1126a and 1126b and valve 1128. When the reducing solution begins to leave the bottom of the catheter, as indicated by a change from a clear solution to a grey color, valve 1128 is closed, and needle 1130 is removed. The remaining reducing solution is allowed to drip out, which takes about 5 minutes. In theory, this method for plating results in a thicker coating of plate at the upper end of the lumen, where the reactants are more active, and a thinner coat at the lower or exit end. However. the smallest lumen expected to be used has a diameter of about 0.5 mm or 500 µm, so that a typical coating thickness of about one to three microns ($10^{-6}$ meter) is not significant by comparison, and a variation of even 3:1 in coating thickness, to about 3 to 9 microns, will have no significant effect on the effective lumen diameter. If multiple coats are to be applied by this method, and the buildup of plating at the entrance end is considered to be a problem, the difference in thickness between ends may be reduced by applying the solution alternately to the ends, i.e. by interchanging the upper and lower ends of the catheter in the arrangement of FIG. 11 between platings.

As an alternative to the use of gravity alone, the gravitational force may be augmented by fluid pressure, as by pressurizing reservoirs 1114 and 1124 of FIG. 11.

Figure 12:
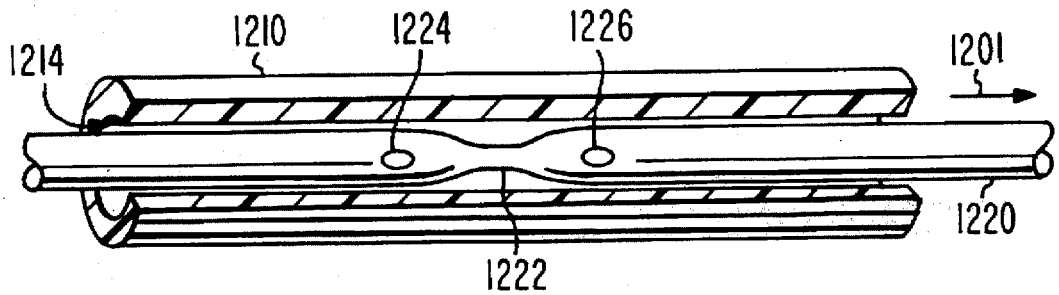
FIG. 12 is a view, partially cut away, of an application tube by which reactants are introduced into the lumen of a catheter according to another aspect of the invention.

FIG. 12 illustrates a portion of catheter 1210, partially cut away longitudinally to illustrate the interior of the lumen 1214, and as an aid to understanding a method for depositing a uniform coating. In FIG. 12, lumen 1214 is prepared by cleaning, etching and sensitizing steps as described above, and an application tube 1220 is drawn therethrough in the direction of arrow 1201. Tube 1220 is pinched off at a location 1222, sealing its lumen (not separately illustrated) and thereby forming two independent coaxial tubes, one leading and one lagging relative to the direction 1201 of motion. Apertures 1224 and 1226 adjacent to pinchoff point 1222 open into the ends of the lumens of the lagging and leading lumens, respectively, of tube 1220. During the drawing operation, silver plating solution is pumped into the leading lumen of tube 1220, and exits from aperture 1226, and reducing solution is pumped into the lagging lumen and exits from aperture 1224. Thus, fresh solution is introduced along the length of the lumen being plated, providing a uniform coating.

Figure 13:
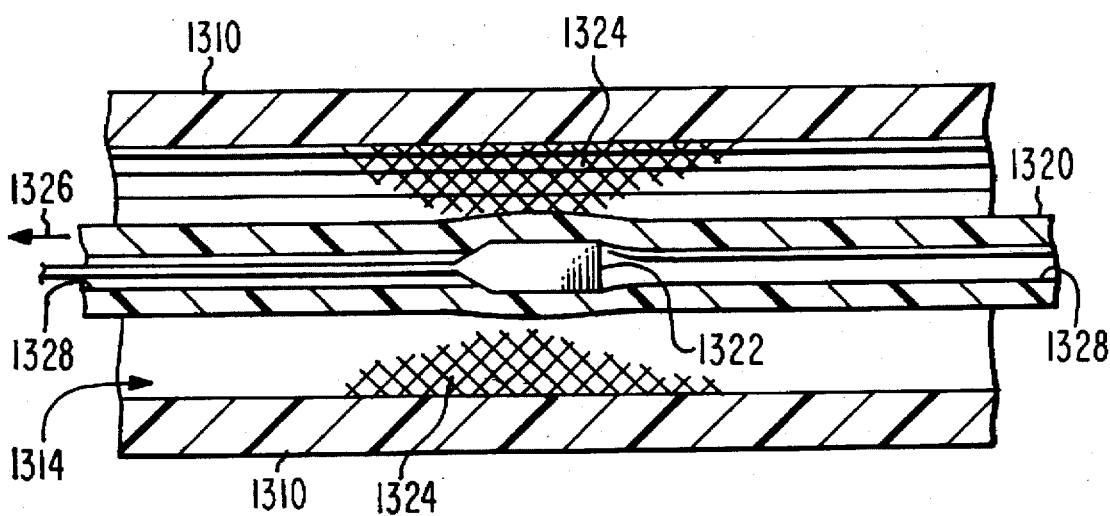
FIG. 13 is a view, partially cut away, of another applicator tube and its plug, arranged to introduce reactants to the interior of a lumen.

FIG. 13 illustrates another arrangement for applying silver plating and reducing solutions to the interior of a catheter. FIG. 13. a portion 1310 of a catheter is sectioned to illustrate the lumen 1314. After lumen 1314 is prepared as described above, a spongy tube 1320 impregnated with reducing solution is introduced into the lumen 1314 of the catheter, following which silver plating solution is flowed into lumen 1314 in the region, designated 1324, is surrounding tube 1320. When reducer-saturated tube 1320 completely surrounded by plating solution, a tapered plug or plunger 1322 is pulled through the reducer-saturated tube, in the direction of arrow 1326, causing the spongy material of tube 1320 to be compressed adjacent to the plug, and to release its reducer into the adjacent silver plating solution in region 1324. The mixture of plating and reducing solutions causes plating of the adjacent wall of lumen 1314. ideally, reducer tube 1320 should have an impervious inner surface, illustrated as 1328 in FIG. 13, so that pulling plug 1322 therethrough forces the reducer solution to flow only to the outside of the reducer tube, rather than allowing some of the reducer solution to flow into the interior of the lumen of reducer tube 1320, ahead of and behind plug 1322.

Figure 14:
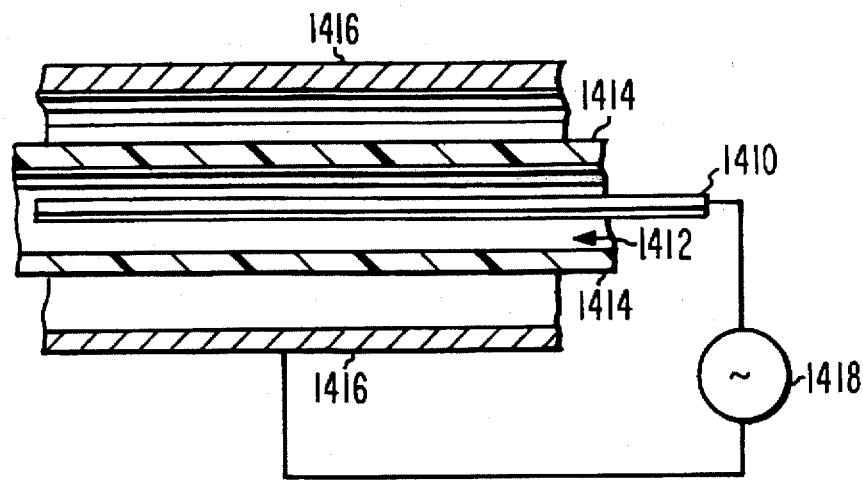
FIG. 14 is a simplified representation of an alternating-current or radio frequency (RF) sputtering technique useful in applying coatings to the interior of the lumen of a catheter.

According to another aspect of the invention, the inside or lumen of a polymer or other dielectric catheter or other tube may be sputtered with metal. This is accomplished by an elongated wire target electrode 1410 in FIG. 14, extending through the lumen 1412 of a dielectric catheter tube 1414, which may be a polymer, and a concentric electrode enclosure 1416 surrounding the exterior of the tube 1414. all in a low-pressure inert gas atmosphere. Enclosure 1416 may be a metallic coating previously applied to the exterior surface by cylindrical magnetron sputtering, as described above, in which case low pressure gas need only be applied to lumen 1412. In FIG. 14, an alternating voltage, which may be at a radio frequency (RF).is applied by a source 1418 between wire target electrode 1410 and the surrounding exterior electrode 1416, with the result that the high voltage creates a plasma discharge in the gas filled regions between the electrodes. This plasma is ionized by a few percent. The plasma discharge ionizes the low-pressure inert gas, which produces ions of metal atoms. The target electrode wire assumes a negative DC potential almost equal to the peak applied RF potential, as a result of a large electron current flowing to the wire during the positive half-cycle of the RF wave, and the inability of relatively immobile positive ions to neutralize this charge during the negative half-cycle. Those positive ions reaching the target acquire the aforementioned potential energy, and upon impact on the target can eject, or sputter, atoms of the target material, which can then deposit on the inner surface of the lumen.

In accordance with an aspect of the invention, metals are applied to at least some surfaces of the catheter by a combination of sputtering, preceded or preferably followed by electrochemical deposition. Such a combination is particularly advantageous for application to the exterior of the catheter. For example, a first coating of silver may be applied to a surface by sputtering to a thickness of about 1000 Å. This layer can then be thickened by conventional electroplating methods. The combination of deposition methods has the advantage of first using a method suited to solving the difficult problem of producing an adherent metal coating on a polymeric surface, and then using an economical and well controlled method to increase the thickness of the coating to the desired value.

Figure 16:
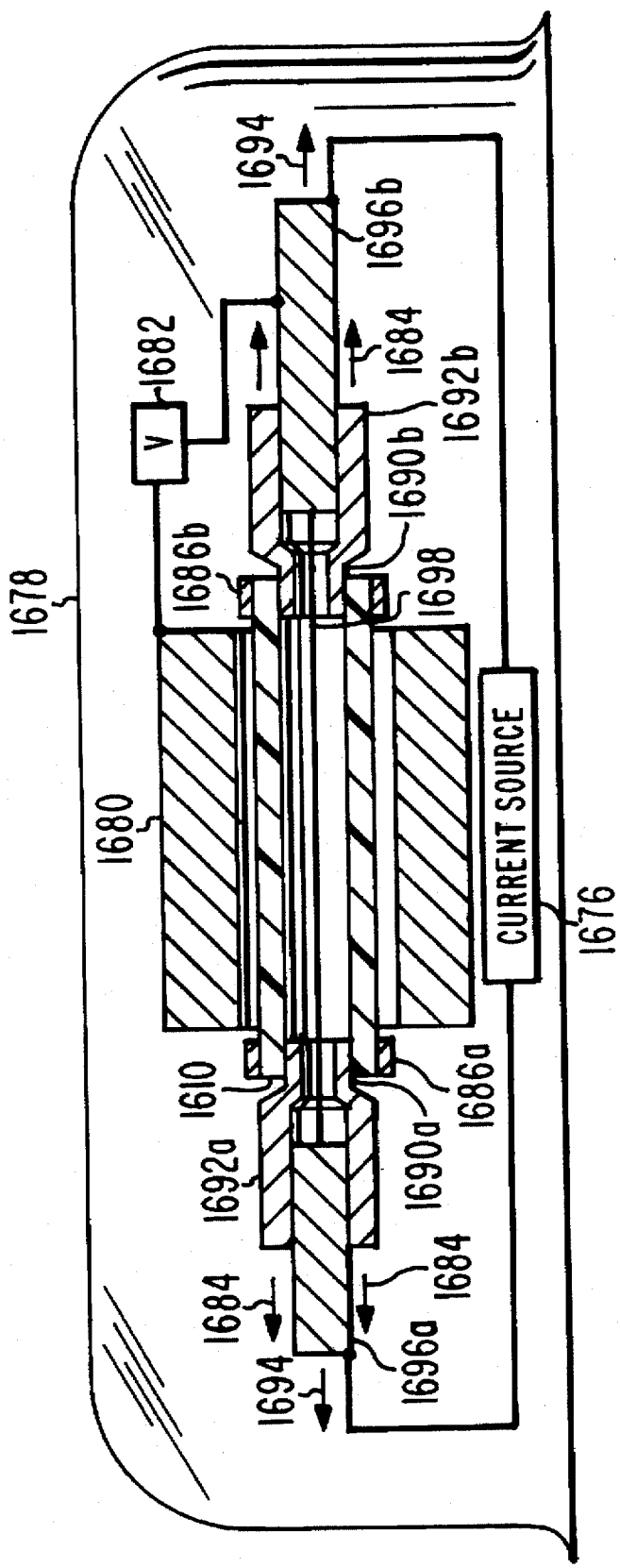
FIG. 16 is a simplified representation of an arrangement for holding a wire electrode centered within a lumen of a tube during sputtering.

FIG. 16 illustrates a method for holding a conductive wire centered within a dielectric tube, so that voltage can be applied to the wire relative to an exterior electrode. In FIG. 16, a conductive wire 1698 is brazed or otherwise connected to two connection pieces 1696a and 1696b, which are held in tension, as suggested by arrows 1694 to keep wire 1698 straight. A pair of mandrels 1692a, 1692b have inner bores dimensioned for a sliding fit over connection pieces 1696a and 1696b, respectively. Mandrels 1692a and 1692b each include a necked portion 1690a, 1690b, respectively, dimensioned to fit within the lumen of a dielectric tube 1610. A pair of tensioned rings 1686a, 1686b hold the ends of dielectric tube 1610 to mandrels 1692. The mandrels are pulled apart, as suggested by arrows 1684, to place dielectric tube 1610 in tension, whereby the tube is straight and does not contact the wire. Preferably, the tube and wire are oriented vertically to avoid sagging. A voltage source illustrated as a block 1682 is connected between an exterior electrode 1680 and connection piece 1696b, to provide a potential between wire 1698 and exterior electrode 1680. The structure of FIG. 16 may be maintained inside a bell jar 1678, in which gas pressure is maintained at a suitable Level for sublimation or evaporation or the wire material, about $10^{-5}$ to $10^{-6}$ torr. A current source, illustrated as a block 1676, applies current to wire 1698 to heat it to evaporate or sublime to thereby produce free atoms. The evaporant or sublimed material coats the interior of the tube. As an alternative, the pressure and voltage may be selected for a glow discharge, in which case the action corresponds to the abovedescribed sputtering.

FIG. 16, the tensioning of the dielectric tube by means of mandrels 1692 may be dispensed with if the inner diameter of electrode 1680 is made to closely fit the exterior of the tube, and the electrode is maintained coaxial with wire 1698, to act as a fitted holder for the tube.

Other embodiments of the invention will be apparent to those skilled in the art. For example, while silver has been described as the base or foundation coat upon which the succeeding layers of metals are formed, coated or layered, other stable foundation coating materials may be used in the same fashion. Particularly advantageous foundation coating materials include chromium, titanium and nickel. Other useful metals include aluminum, gold and tungsten. While a single lumen has been described, a plurality of lumens may be used, centered on the axis of the catheter, and not centered, and extending to the exterior of the catheter as described, or not so extending, as might be the case with a balloon inflation lumen. Naturally, lumens which do not extend to the exterior of the catheter need not be, but may be coated with metals as described. Other advantageous configurations include catheters in which the inner surface (of the lumen) or the outer surface are implanted with metal inclusions, either by ion implantation as described above, or by molding the catheter from a polymeric material in which metal particles are imbedded, as appears to be the case with the Crossley arrangement, and onto which further smooth Layers of material are applied by the methods described above, thereby taking advantage of the good adherence of the implanted material to help with the adhesion of sputtered or electroless chemical layers.

What is claimed is:

1. A method for fabricating a catheter in which a lumen is metal-coated, comprising the steps of:

preparing an inner surface of an elongated polymer tube;

electroless depositing a layer of a metal onto said inner surface, wherein said step of preparing said inner surface comprises the steps of:

cleaning said inner surface with an ultrasonic cleaner in a solution of one of 2-Propanol and isopropyl alcohol $CH_3CHOHCH_3$;

drying; and etching said inner surface with a solution of sodium naphthalene in diethylene glycol dimethyl ether with a concentration of sodium naphthalene of approximately 0.7 Mol/liter.

2. A method for fabricating a catheter in which a lumen is metal-coated, comprising the steps of:

preparing an inner surface of an elongated polymer tube;

electroless depositing a layer of a metal onto said inner surface, wherein said step of preparing said inner surface comprises the steps of:

cleaning said inner surface with an ultrasonic cleaner in a solution of one of 2-Propanol and isopropyl alcohol $CH_3CHOHCH_3$;

drying; and etching said inner surface with a solution of sodium naphthalene in diethylene glycol dimethyl ether with a concentration of sodium naphthalene of approximately 0.7 Mol/liter; further comprising the steps of:

washing said lumen a first time with one of N-butyl alcohol, methyl alcohol, and acetone;

rinsing with deionized water following said step of washing a first time;

following said step of rinsing, etching with sulfochromic acid solution containing about 75 g/l chromic acid, and 250 g/l sulfuric acid, at room temperature for a duration of 20 seconds;

following said step of etching with sulfochromic acid solution, washing a second time with distilled water;

following said step of etching with sulfochromic acid solution, cleaning in diluted hydrochloric acid;

following said step of cleaning in diluted hydrochloric acid, rinsing a second time with deionized water;

following said step of rinsing a second time, sensitizing with a solution containing 70 g/l stannous chloride, and 40 ml/l of hydrochloric acid, at room temperature for between 5 and 15 minutes;

following said step of sensitizing, washing a second time with deionized water;

following said sensitizing step, activating with a solution containing 1 g/l of palladium chloride, and 5 ml/l of hydrochloric acid, at room temperature for five to ten minutes;

following said step of sensitizing, rinsing a third time with deionized water;

following said step of rinsing a third time, plating by flowing a silver plating solution at room temperature through the lumen of the catheter, said silver plating solution containing 0.05 to 0.6M $AgNO_3$, $4.3 \times 10^{-4}$M dodecylbenzenesulfonic acid acid sodium salt ($C_{12}H_{25}C_6H_4SO_3Na$), 4.75M ammonium hydroxide ($NH_4OH$), and a quantity of acetic acid ($CH_3CO_2H$) sufficient to bring the final pH into the range from 7.5 to 10; and adding a reducer solution one of immediately prior to and concurrently with application of said plating solution, said reducer solution containing 0.15M of hydrazine ($N_2H_4 \cdot xH_2O$).

3. A method for coating the interior of a dielectric tube, comprising the steps of:

inserting a conductive target wire electrode into the lumen of said dielectric tube;

maintaining an atmosphere of gas around said wire electrode at a pressure sufficient to allow glow discharge; and applying RF voltage between said wire electrode and an electrode exterior to said tube which is sufficient to cause said glow discharge, whereby said wire electrode produces coating atoms.

4. A method according to claim 3, comprising the further step of maintaining said wire electrode spaced away from the walls of said lumen.

5. A method according to claim 4, wherein said step of maintaining said wire electrode spaced includes the further step of:

tensioning said wire electrode within said dielectric tube.

6. A method according to claim 5 wherein said maintaining step includes the step of:

placing said exterior electrode about said tube with a bore of said exterior electrode concentric with said wire.

7. A method according to claim 3 wherein said step of apply RF includes the steps of:

plating said exterior electrode onto an exterior surface of said tube; and connecting a terminal of a source of RF to said exterior electrode.

8. A method for coating the interior of a dielectric tube, comprising the steps of:

inserting an electrically conductive target wire into the lumen of said dielectric tube;

maintaining said wire spaced away from the walls of said lumen;

maintaining an atmosphere of gas around said wire sufficiently low for efficient sublimation; and passing a current through said wire sufficient to heat said wire to sublime.

9. A method according to claim 8 wherein the material of said conductive wire is selected to be one of chromium and titanium.

* * * * *